United States Patent [19]

Suzuki

[11] Patent Number: 4,896,194
[45] Date of Patent: Jan. 23, 1990

[54] SEMICONDUCTOR DEVICE HAVING AN INTEGRATED CIRCUIT FORMED ON A COMPOUND SEMICONDUCTOR LAYER

[75] Inventor: Katumi Suzuki, Tokyo, Japan
[73] Assignee: NEC Corporation, Tokyo, Japan
[21] Appl. No.: 216,746
[22] Filed: Jul. 8, 1988

[30] Foreign Application Priority Data

Jul. 8, 1987 [JP] Japan .................................. 62-171535

[51] Int. Cl.$^4$ .................... H01L 29/267; H01L 29/06
[52] U.S. Cl. ......................................... 357/16; 357/60; 357/61; 357/55; 357/4; 333/246
[58] Field of Search ....................... 357/16, 60, 61, 55, 357/4; 333/246

[56] References Cited

U.S. PATENT DOCUMENTS

| | | | |
|---|---|---|---|
| 4,551,394 | 11/1985 | Betsch | 357/16 |
| 4,706,100 | 11/1987 | Tufte | 357/16 |
| 4,739,389 | 4/1988 | Grodbloed | 357/55 |
| 4,772,929 | 9/1988 | Manchester | 357/55 |
| 4,774,205 | 9/1988 | Choi | 357/16 |

FOREIGN PATENT DOCUMENTS

59-123270  7/1984  Japan ..................................... 357/55

OTHER PUBLICATIONS

R. Fischer, T. Henderson, J. Klem, W. Kopp, C. K. Peng, H. Morkoc, J. Detry and S. C. Blackstone, "Monolithic Integration of GaAs Modulation-Doped Field Effect Transistors and N-Metal-Oxide-Semiconductor Silicon Circuits", Appl. Physics Letter 47, Nov. 1, 1985, pp. 983–985.

M. Eron, G. Taylor, R. Menna, S. Y. Narayan, and J. Klatskin, "X-Band MMIC Amplifier on GaAs/Si", IEEE Electron Device Letters, vol. EDL.-8, No. 8, Aug. 1987, pp. 350–352.

R. J. Fischer, W. F. Kopp, J. S. Gedymin, and H. Morkoc, "Properties of MODFET's Grown on Substrates at DC and Microwave Frequencies", IEEE Transactions on Electron Devices, vol. ED-33, No. 10, Oct. 1986, pp. 1407 to 1412.

Primary Examiner—Andrew J. James
Assistant Examiner—Jerome Jackson, Jr.
Attorney, Agent, or Firm—Helfgott & Karas

[57] ABSTRACT

A semiconductor device includes a Si substrate, a compound semiconductor layer selectively formed on one main surface of the Si substrate, a hole formed in the Si substrate to expose a portion of a back surface of the compound semiconductor layer, a microwave monolithic integrated circuit formed on a portion of an upper surface of the compound semiconductor layer just above the exposed portion of the back surface, and a metal layer covering the back surface of the Si substrate, the side walls of the hole and the exposed portion of the back surface of the compound semiconductor layer. A Si device may be formed on the portion of the upper surface of the Si substrate where the compound semiconductor layer is not formed. GaAs may be used for the compound semiconductor layer and the metal layer is connected to the ground line.

10 Claims, 3 Drawing Sheets

SEMICONDUCTOR DEVICE HAVING AN INTEGRATED CIRCUIT FORMED ON A COMPOUND SEMICONDUCTOR LAYER

BACKGROUND OF THE INVENTION

1. Field of the Invention

The present invention relates to a semiconductor integrated circuit formed on a composite semiconductor chip having a compound semiconductor layer on a silicon substrate.

2. Description of the Related Art

To obtain a semiconductor integrated circuit device for a microwave frequency signal, attempts have been made to form a microwave monolithic integrated circuit (MMIC) on a GaAs layer grown on a Si substrate, as disclosed in "IEEE Electron Device Letters", Vol. EDL8, No. 8 (1987), pp. 350–352.

A greater area of the GaAs layer was, however, occupied by input and/or output impedance matching circuit of the GaAs MMIC. Therefore, in order to make the area of the MMIC small, it was necessary to reduce the area occupied by the impedance matching circuit. The area of the impedance matching circuit depends on the thickness of the GaAs/Si wafer (GaAs layer plus Si substrate). Therefore, the thickness of the wafer should be made thinner to reduce the area occupied by the matching circuit.

However, the GaAs/Si wafer used in the "IEEE Electron Device Letters" had a thickness as large as 125 μm, and the area occupied by the MMIC could not be made small.

It would be conceivable to grind the bottom surface of the silicon substrate of the GaAs/Si wafer to reduce its thickness, but the mechanical strength of the wafer requires a thickness in the range of at least 30–50 μm. Thus, a large area is still necessary for the GaAs MMIC. In addition, the film thickness would not become sufficiently uniform through grinding. Consequently, matching of the characteristic impedance would be difficult in the impedance matching circuit, and it would be impossible to obtain excellent high-frequency characteristics.

SUMMARY OF THE INVENTION

It is, therefore, an object of the present invention to provide a miniaturized monolithic integrated circuit with excellent high-frequency characteristics.

The semiconductor device in accordance with the present invention includes a Si substrate, a compound semiconductor layer selectively formed on a main surface of the Si substrate, a hole formed in a portion of the Si substrate on which the compound semiconductor layer is formed so as to expose the bottom face of the compound semiconductor layer, a plurality of circuit elements formed on an upper main surface of the compound semiconductor layer, and a metal layer formed on the bottom face of the Si substrate and extending through the hole to cover the exposed bottom face of the compound semiconductor layer.

On the other portion of the Si substrate than the portion where the compound semiconductor layer is formed, at least one circuit element or an integrated circuit may be formed. GaAs may be typically used as the compound semiconductor, and the ground potential is ordinarily applied to the metal layer.

The bottom face of the compound semiconductor layer is partially exposed from the Si substrate, and the peripheral portion of this layer is supported by the Si substrate at the periphery of the hole. It is, therefore, possible to make this compound semiconductor layer sufficiently thin with its mechanical strength maintained.

The hole may be formed by etching and it is possible to increase a difference in an etching rate between the Si and compound semiconductor by selecting a suitable etchant. Therefore, when etching is performed from the back surface of the Si, the compound semiconductor acts as an etching stopper, and the hole exposing a predetermined portion of the compound semiconductor can be formed easily in the silicon substrate. The compound semiconductor can be hetcroepitaxially grown on a Si substrate by molecular beam epitaxy (MBE) or vapor phase epitaxy. It is, therefore, possible to provide a monolayer-controlled thin compound semiconductor layer with an excellent uniformity. Therefore, the distance between the monolithic IC formed on the upper main surface of the compound semiconductor layer and the metal layer formed on the bottom surface of the compound semiconductor layer is equal to the film thickness of the compound semiconductor layer. Since the film thickness of the compound semiconductor is determined by the epitaxial growth of the compound semiconductor layer and the etching of a Si substrate with the compound semiconductor layer used as an etching stopper, the distance between the monolithic IC on the compound semiconductor layer and the metal layer can be made extremely short with excellent uniformity and excellent controllability. Consequently, it is possible to provide an integrated circuit using a compound semiconductor, which is miniaturized and excellent in high frequency characteristics.

Furthermore, heat dissipation from the integrated circuit on the compound semiconductor layer is good because of the metal layer formed on the back faces of the compound semiconductor layer and the Si substrate. It is, therefore, possible to provide a higher-power and more miniaturized monolithic integrated circuit using a compound semiconductor. This integrated circuit can be used not only for a high frequency application but also as an ordinary high-power compound semiconductor device.

Additionally, according to the present invention, it is possible to form a large scale integrated circuit on the Si wafer. High frequency signals can be processed in the compound semiconductor integrated circuit, and the low frequency signals can be processed in the Si integrated circuit. Therefore, it is possible to effectively utilize both features of the high-frequency performance of the compound semiconductor and the high density integration of Si integrated circuits. According to the present invention, the monolithic integrated circuit using compound semiconductor can be miniaturized and the area of the Si substrate can be enlarged.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENT

Figure 1:
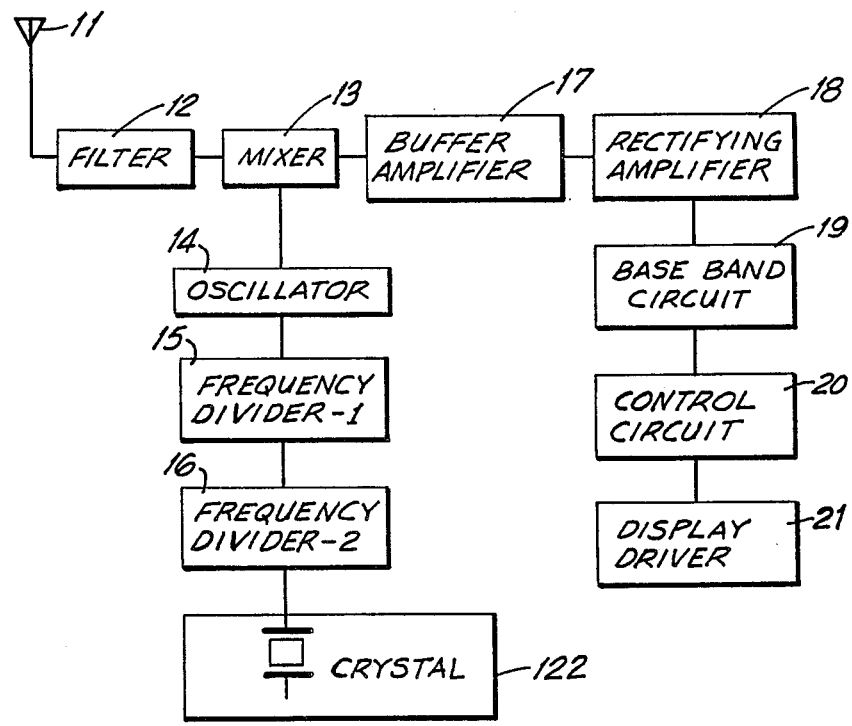
FIG. 1 is a block diagram of a portable data transmitter-receiver of a paging system for explaining a preferred embodiment of the present invention.

Referring to FIG. 1, a portable data transceiver for a paging system includes an antenna 11, a filter 12, a mixer 13, an oscillator 14, a first frequency divider 15, a second frequency divider 16, a crystal vibrator 122, a buffer amplifier 17, a rectifying amplifier 18, a base band circuit 19, a control circuit 20 and a display divider 21. The filter 12, the mixer 13, the oscillator 14, the first frequency divider 15 and the buffer amplifier 17 are formed on a GaAs layer, and the rectifying amplifier 18, the base band circuit 19, the control circuit 20, the display divider 21 and the second frequency divider 16 are formed on a Si substrate with complementary metal oxide semiconductor (CMOS) circuits.

Figure 2A:
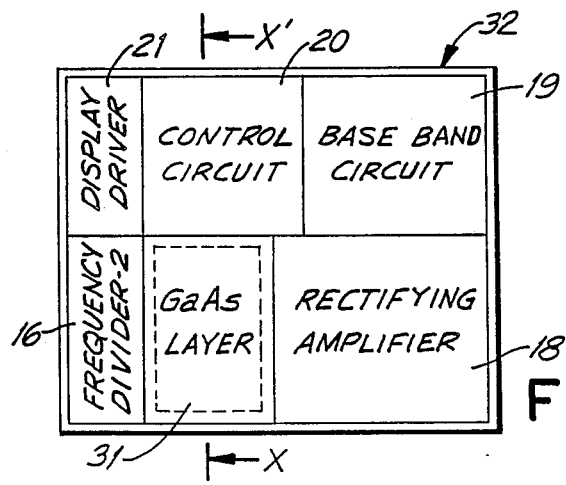
FIG. 2(a) is a plan view showing a semiconductor device in accordance with a preferred embodiment of the present invention, FIG. 2(b) being a sectional view taken along the line X-X' of FIG. 2(a), FIG. 2(c) being a plan view showing a GaAs IC formed on the GaAs layer of FIG. 2(a) and FIG. 2(d) being a perspective sectional view showing a part of GaAs IC of FIG. 2(c)
Figure 2B:
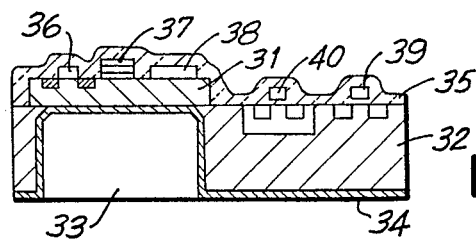

Referring to FIG. 2(a) and 2(b), a GaAs layer 31 of 300 $\mu$m wide (length is 1 mm) is formed on a P-type Si substrate 32 having a width of 7 mm, a length of 7 mm and a thickness of 400 $\mu$m. A hole 33 of 200 $\mu$m wide and 900 $\mu$m long is formed in the Si substrate 32 to expose the back surface of the GaAs layer 31. The periphery of the GaAs layer 31 with a width of 50 $\mu$m is not exposed. A metal layer 34 is formed on the back surface of the Si substrate 32, on the side wall of the hole 33 and on the exposed back surface of the GaAs layer 31. The metal layer 34 is ordinarily grounded. A passivation film 39 is formed to cover the GaAs IC formed on the GaAs layer 31 and the Si LSI formed on the Si substrate 32.

On the Si substrate 32, formed are the second frequency divider 16, the rectifying amplifier 18, the base band circuit 19, the control circuit 20 and the display driver 21. These functional blocks are constructed with CMOS circuits having n-channel MOS transistors 39 and p-channel MOS transistors 40. These functional blocks may also be constructed with Bipolar-CMOS circuit.

Figure 2C:
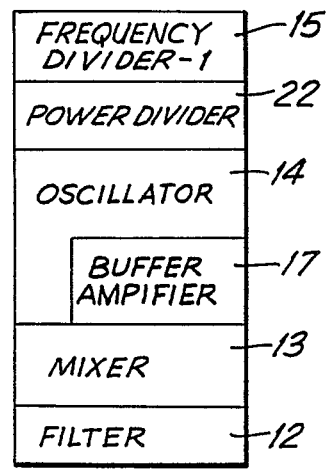
Figure 2D:
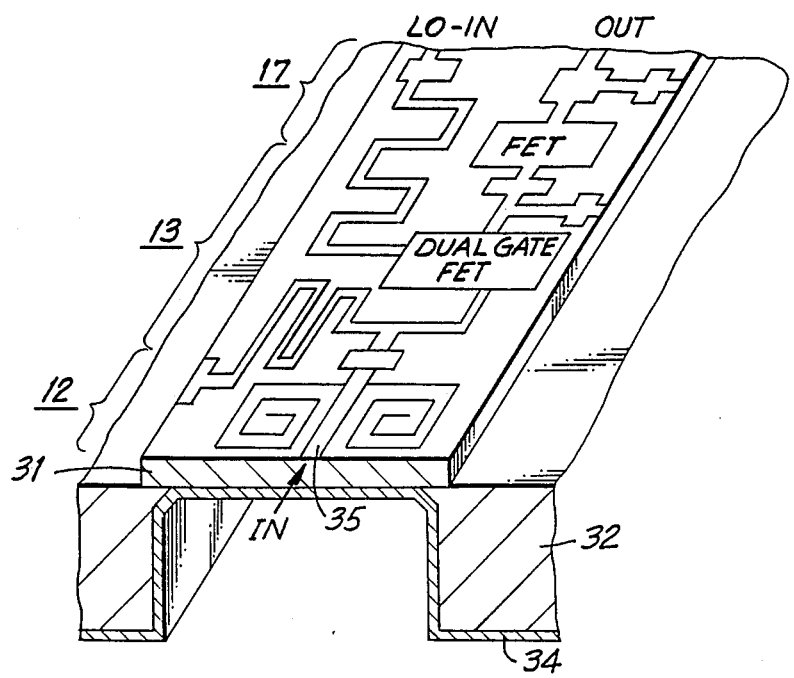

Referring to FIG. 2(b) and FIG. 2(c), a center portion of the GaAs layer 31 has a width of 200 $\mu$m and a length of 900 $\mu$m, on which the filter 12, the mixer 13, the divider 15 and the buffer amplifier 17 are formed. These functional blocks are constructed with field effect transistors (FETs) 36, metal-insulator-metal (MIM) capacitors 37 and inductive transmission lines 38. The output of the buffer amplifier 17 is inputted to the rectifying amplifier 18 formed on the Si substrate 32 and the first frequency divider 15 is connected to the second frequency divider 16 formed on the Si substrate 32. Referring to FIG. 2(d), meander type and spiral type transmission lines are used in the functional blocks such as filter 12. The signals from the antenna 11 are inputted to the input portion 35 of the filter 12.

The thickness of the GaAs layer 31 is 4 $\mu$m. The periphery of the GaAs layer 31 are supported by the Si substrate 32, and the width of the supported side portion of the GaAs layer 31 is 50 $\mu$m. Therefore, mechanical strength of the GaAs layer 31 is sufficient in the practical use in spite of the thin film thickness of 4 $\mu$m.

The thickness of the GaAs layer 31 is preferably from 2.5 $\mu$m to 10 $\mu$m. When it is below 2.5 $\mu$m, density of misfit dislocations caused by a difference in the lattice constants between the GaAs layer 31 and the Si substrate 32 becomes too high. When it is over 10 m, the step from the Si substrate 32 to the GaAs layer 31 becomes too high.

When the film thickness of the GaAs layer is changed, the areas of the GaAs layer necessary for the FETs and MIM capacitors to show the same characteristics are not changed. However, an area necessary for the inductive transmission lines greatly depends on the film thickness of the substrate. Therefore, in using a GaAs/Si wafer where a GaAs layer is formed on a Si substrate and the backside of the Si substrate is ground to the thickness of 150 $\mu$m, the GaAs layer must have an area of 1.6 mm$\times$6.0 mm to obtain the same high frequency characteristics as the 300 $\mu$m$\times$1 mm.

A GaAs IC is used as the input portion for the high frequency signals. Therefore, the GaAs layer 31 is formed on the one side of the Si substrate 32 to reduce the transmission loss. When the GaAs layer 31 is formed at an inner portion of the Si substrate 32, the transmission loss becomes somewhat large, but the mechanical strength of the GaAs/Si substrate becomes large. Since the occupying area can be reduced by thinning the substrate thickness, one or more holes 33 may be formed to expose only portion or portions of the backside of the GaAs layer 31 where the inductive transmission, lines are formed, resulting in obtaining a semiconductor device of large mechanical strength.

With the impedance of the GaAs ICs remained at 50 $\Omega$, the transmission loss increases when the width of the transmission lines become small by reducing the thickness of the GaAs substrate. However, when the device elements are integrated to form the monolithic IC as the present embodiment, impedance between the circuits is not necessary to be fixed at 50 $\Omega$. Since the input impedance of the FET is smaller than 50 $\Omega$, there has been difficulty in contriving the matching circuit. However, by thinning the substrate thickness, it becomes easy to reduce the impedance of the transmission lines, though the width of the transmission line is smaller than the prior art.

Figure 3A:
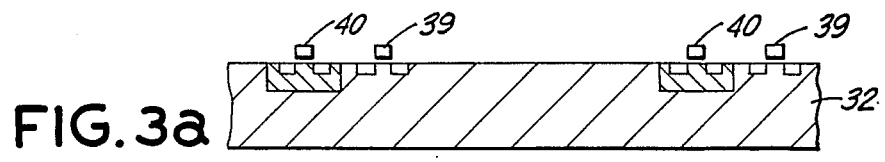
FIGS. 3(a) to 3(e) are sectional views showing principal steps for manufacturing the semiconductor device shown in FIGS. 2(a) to 2(d).
Figure 3B:
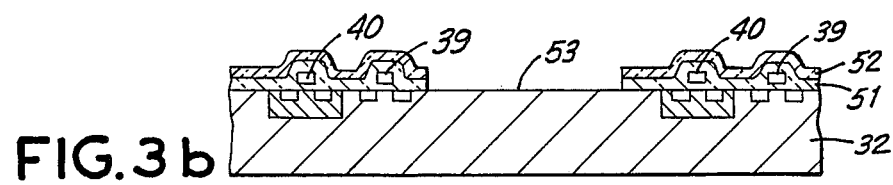

Referring to FIG. 3(a), a plurality of n-channel MOS transistors 39 and p-channel MOS transistors 40 to constitute Si LSI blocks are first formed on a p-type Si wafer 32 oriented 2° off from (100) plane towards <110> direction and having a diameter of 2 inches and a thickness of 400 $\mu$m. Referring to FIG. 3(b), a silicon dioxide (SiO$_2$) film 51 having a thickness of 2000 Å and a silicon nitride film 52 having a thickness of 300 Å are then deposited in this order, by a low pressure chemical vapor deposition (LPCVD) method. Next, the silicon nitride film 52 and the SiO$_2$ film 51 are selectively removed to form an opening portion 53 having an area of 300 $\mu$m$\times$1 mm.

Figure 3C:
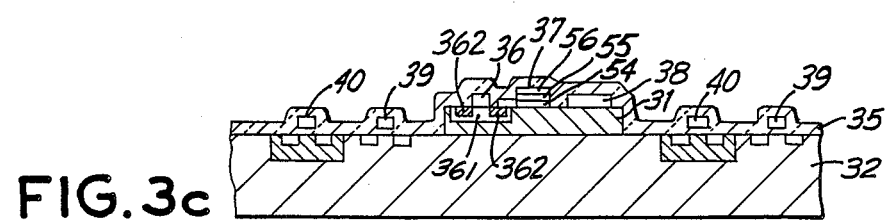

Referring to FIG. 3(c), the silicon substrate 32 is introduced into a reaction tube for an organometallic vapor phase epitaxy (OMVPE). In the presence of H$_2$ and AsH$_3$, the silicon substrate 32 is gradually heated from room temperature up to 900° C., kept for 5 minutes at this temperature, and then gradually cooled down to 400° C. Next, an extremely thin GaAs layer is formed as a buffer layer by adding a trimethylgallium (TMG) for one minute at 400° C. Thereafter, the silicon substrate 32 is heated up to 730° C. in an atmosphere of H$_2$ and AsH$_3$.

Next, a non-doped GaAs layer 31 having a thickness of 4 μm is selectively formed on the exposed Si substrate 32 at the opening portion 53, molar ratio of AsH$_3$ to TMG (AsH$_3$/TMG) being kept at 20, the substrate temperature being kept at 730° C. and the growth rate being 0.02 μm/min. In some cases, GaAs is partly deposited on the silicon nitride film 52, but this partly deposited GaAs is easily eliminated by use of a mixed solution of sulfuric acid and hydrogen peroxide. The silicon nitride film 52 and SiO$_2$ film 51 are then removed.

Next, Si ions are implanted into the thus formed GaAs layer 31 to form an active region 361 and n$^{30}$ source/drain regions 362 of the field effect transistor (FET) 36 and a resistor region (not shown). Ohmic contacts are formed on the n$^{30}$ regions and portions of the resistor region by use of Au-Ge and Ni. Next, a gate of the FET 36 is formed by use of an Al film and wirings made of Ti and Au layer or Ti/Pt/Au layers are formed on the GaAs layer 31 and connected to the ohmic contacts for the n+ source/drain region 362. One of these wirings is also used as a first layer electrode 54 of the metal-insulator-metal (MIM) capacitor 37. Next, silicon nitride is deposited by a chemical vapor deposition (CVD) method to form an dielectric layer 55 for the MIM capacitor 37. Next, a second layer electrode 56 of the MIM capacitor and an inductive transmission line 38 are formed by evaporating Ti and Au in this order and plating an Au film of 3 μm in thickness on this evaporated Au film. Thereafter, a passivation film 35 of silicon dioxide and silicon nitride is formed.

Figure 3D:
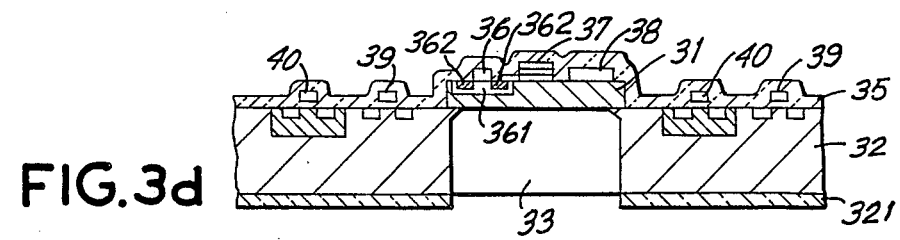

Then the back surface of the Si substrate 32 is covered with a SiO$_2$ film 321 except for a portion where a hole is to be formed and the uncovered portion of the Si substrate 32 is etched away from the backside by a reactive ion etching (RIE) method by use of SF$_6$ to form a recess of 350 μm in depth just under the GaAs layer 31. Next, the exposed Si substrate 32 in this recess is selectively etched in the KOH solution of 50 percent and at the temperature of 90° C. to complete a hole 33 which exposes the back surface of the GaAs layer 31, as shown in FIG. 3(d). The exposed portion of the back surface of the layer 31 has an area of 200 μm wide and 900 μm long. Since GaAs is not etched by this KOH solution, the GaAs layer 31 works as an etching stopper. The uniformity in the film thickness of the GaAs layer 31 is within ±5 percent over the exposed area of 200 μm×900 μm in the present embodiment.

Figure 3E:
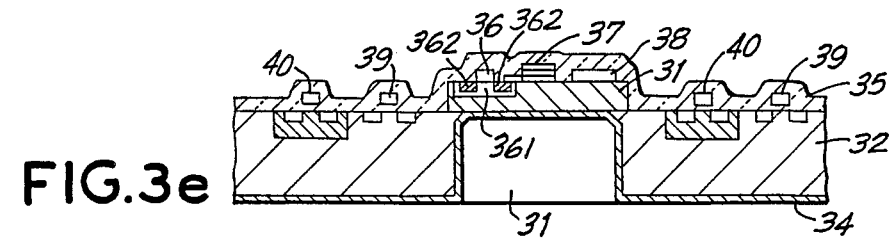

Referring to FIG. 3(e), the SiO$_2$ film 321 is removed and a metal layer 34 is formed over the back surface of the Si substrate 32, the side walls of the hole 33 and the exposed back surface of the GaAs layer 31 by depositing a Ti film of 1000 Å in thickness and a Au film of 2 μm in thickness in this order. Thereafter, the silicon wafer is diced into chips, each having an area of 7 mm×7 mm to obtain a monolithic semiconductor devices shown in FIG. 2.

Other compound semiconductor materials such as InP, GaAlAs, InGaAs, than GaAs may be used for the compound semiconductor layer 31. Moreover, a multilayer structure made of two or more of these compound semiconductor materials can also be used. If a GaAs layer having a small film thickness of such as about 1 μm is used as the ground layer for these compound semiconductor layer, this thin GaAs ground layer acts as an etching stopper and a similar manufacturing method as the present embodiment may be used.

Furthermore, a semiconductor device having the same structure as the present embodiment may also be manufactured by a growth of a GaAs layer over the entire surface of the substrate, instead of a selective epitaxial growth of GaAs, and by a subsequent selective etching of the GaAs layer.

What is claimed is:

1. A semiconductor device comprising:
    a silicon substrate;
    a compound semiconductor layer selectively formed on a main surface of said silicon substrate;
    a hole formed in a portion of said silicon substrate on which said compound semiconductor layer is formed so as to expose the bottom surface of said compound semiconductor layer;
    at least one circuit element formed on the upper surface of said compound semiconductor layer; and
    a metal layer formed on the bottom surface of said silicon substrate, said metal layer extending through said hole to cover the exposed bottom surface of said compound semiconductor layer.

2. A semiconductor device as claimed in claim 1, wherein said bottom surface of said compound semiconductor layer is exposed only under the portion of said upper surface where said circuit element is formed.

3. A semiconductor device as claimed in claim 1, wherein an inductive transmission line of a microwave monolithic integrated circuit is formed on said compound semiconductor layer at a portion of said main surface above said exposed bottom surface.

4. A semicondutor device as claimed in claim 1, wherein said compound semiconductor layer is formed of GaAs.

5. A semiconductor device as claimed in claim 1, wherein the thickness of said compound semiconductor layer is from 2.5 μ to 10 μm.

6. A semiconductor device comprising:
    a substrate;
    a compound semiconductor layer selectively formed on a main surface of said substrate
    a hole formed in said substrate to expose a back surface of said compound semiconductor layer, a lower periphery of said compound semiconductor layer being supported by a portion of said substrate surrounding said hole;
    a compound semiconductor device formed on an upper surface of said compound semiconductor layer; and
    a metal layer formed on the back surface of said substrate, said metal layer extending through said hole to cover the exposed back surface of said compound semiconductor layer.

7. A semiconductor device as claimed in claim 6, wherein said substrate is a silicon substrate 8. A semiconductor device as claimed in claim 7, wherein said compound semiconductor device is a microwave monolithic integrated circuit.

9. A semiconductor device as claimed in claim 8 wherein said compound semiconductor layer is formed of GaAs.

10. A semiconductor device as claimed in claim 7, wherein the thickness of said compound semiconductor layer is from 2.5 μm to 10 μm.

* * * * *